United States Patent
Chen et al.

[11] Patent Number: 6,111,788
[45] Date of Patent: Aug. 29, 2000

[54] METHOD FOR PROGRAMMING AND ERASING A TRIPLE-POLY SPLIT-GATE FLASH

[75] Inventors: Chih-Ming Chen; Min-Hwa Chi, both of Hsinchu, Taiwan

[73] Assignee: Worldwide Semiconductor Corp., Taiwan

[21] Appl. No.: 09/382,078

[22] Filed: Aug. 24, 1999

[30] Foreign Application Priority Data

Jun. 24, 1999 [TW] Taiwan ................................. 88110623

[51] Int. Cl.⁷ .................................................. G11C 16/04
[52] U.S. Cl. ............................... 365/185.18; 365/185.29
[58] Field of Search ...................... 365/185.14, 185.18, 365/185.26, 185.27, 185.28, 185.29, 185.33, 218

[56] References Cited

U.S. PATENT DOCUMENTS

| | | | |
|---|---|---|---|
| 5,291,439 | 3/1994 | Kauffmann et al. | 365/185.18 |
| 5,402,371 | 3/1995 | Ono | 365/185.18 |
| 5,455,792 | 10/1995 | Yi | 365/185.14 |
| 5,691,939 | 11/1997 | Chang et al. | 365/185.18 |
| 5,706,227 | 1/1998 | Chang et al. | 365/185.18 |
| 5,856,943 | 1/1999 | Jeng | 365/185.14 |

*Primary Examiner*—Trong Phan
*Attorney, Agent, or Firm*—Fish & Richardson P.C.

[57] ABSTRACT

A method of programming and erasing a triple-poly split-gate flash memory. The memory cell is programmed by substrate hot-electron injection and erased by the tunneling effect and an inversion layer near the drain region. Such programming/erasing procedures can achieve uniform injection with low programming current and high injection efficiency.

6 Claims, 3 Drawing Sheets

| | Substrate1 | Deep Well2 | Drain3 | Source5 | Select Gate20 | Control Gate4 |
|---|---|---|---|---|---|---|
| Programming | Vcc+0.7V | Vcc | 2Vcc | 2Vcc | 0V | 3Vcc |
| Erasing | Vcc | Vcc | 2Vcc | 2Vcc | 2Vcc+Vt | -3Vcc |
| Reading | 0V | Vcc | 2V | 0V | 2V | Vcc |

METHOD FOR PROGRAMMING AND ERASING A TRIPLE-POLY SPLIT-GATE FLASH

BACKGROUND OF THE INVENTION

1. Field of the Invention

The present invention generally relates to a method of programming and erasing flash memories. More specifically, the present invention provides a method of programming and erasing triple-poly split-gate flash memories.

2. Description of the Related Art

Since a flash memory device can be programmed and erased by electronic operations, such as applying different voltages, it has become a widely used memory module.

There are several popular flash memory cell structures. The first flash memory cell is the so-called stacked gate double-poly flash cell, abbreviated by ETOX, as depicted in FIG. 1 (Prior Art). In FIG. 1, numeral 1 represents a substrate layer or substrate region. Numeral 3 represents a drain region and numeral 5 represents a source region. The gate structure is constructed by two stacked polysilicon layers, including an embedded floating gate 10 and an exposed control gate 12 which can be directly applied to voltage signals. Similar to metal-oxide-silicon (MOS) transistors, such a flash memory cell also has an oxide layer 7 between the floating gate 10 and the channel 8 linking the drain region 3 and the source region 5. A dielectric layer 9 is sandwiched between the floating gate 10 and the control gate 12. The dielectric layer 9 can be used to couple the voltage of the control gate 12 to the floating gate 10 for generating a strong electric field to trap electrons. In addition, the dielectric layer 9 also serves as an isolation barrier to encapsulate the electrons trapped in the floating gate 10. Numeral 4 represents spacers around the gate structure.

The programming and erasing procedures of such a stacked gate double-poly flash memory cell are described as follows. Programming or storing data is achieved by channel hot electrons. In detail, a strong electric field, which is induced by the potential difference between the coupled positive voltage of the floating gate 10 and the voltage of the channel 8, can provide electrons with enough kinetic energy to penetrate the oxide layer 7. Therefore, these hot electrons are trapped in the floating gate 10. The presence or absence of the electrons trapped in the floating gate 10 affects the conducting state of channel 8 beneath the floating gate. Therefore, each memory cell can be programmed to store "1" or store "0" according to the absence or presence of the trapped charges in the floating gate 10. Erasing or deleting data is achieved by releasing the trapped charges in the floating gate 10 by Flowler-Nordheim (F-N) tunneling effect. A huge negative voltage is directly applied to the control gate 12 and coupled to the floating gate 10 for driving the trapped electrons in the floating gate 10 to tunnel the oxide layer 7 and to be released through the channel 8 beneath the floating gate or through the source region 5.

However, the conventional stacked gate double-poly flash memory still suffers some drawbacks. For example, the operation of the stacked gate double-poly flash memory has the phenomenon of over-erasing, wherein the threshold voltage of the transistor in the memory cell becomes negative if the erasing operation is overdone. Such a situation may cause the current leakage of the memory column bias circuitry. In addition, the programming current of the programming operation, which is about 0.5~1 mA for each memory cell, is quiet large.

A new cell structure, called the double-poly split-gate memory cell, has been proposed to solve these problems, as shown in FIG. 2 (Prior Art). The improvement in this new cell structure is that the control gate 12 includes an extended control gate portion 12a, which is located over the channel portion 8a near the source region 5. In addition, the oxide layers 7a and 7b are located between the channel portion 8b and the floating gate 10 and between the channel portion 8a and the extended control gate portion 12a, respectively. If the over-erase problem occurs, the extended control gate portion 12a can serve as a controlled switch to isolate the memory cell from the external column bias circuitry. Therefore, the current leakage can be avoided. However, the double-poly split-gate still has a drawback. Referring to FIG. 2, additional space occupied by the extended control gate 12a is required in addition to the space occupied by the floating gate 10 in the conventional memory cell. Therefore, such a memory cell structure occupies a larger chip size.

As described above, the stacked gate double-poly memory cell and the double-poly split-gate memory cell each have their own drawbacks. U.S. Pat. No. 5,856,943 discloses a modified flash memory cell, which overcomes the over-erase issue but does not increase the occupied chip size. Such a modified flash memory cell is called the triple-poly split-gate memory cell, as shown in FIG. 3. The main difference between this cell structure and the conventional two cell structures is in the gate structure. The gate structure comprises three portions, including control gate 24, floating gate 22 and select gate 20. Referring to FIG. 3, there is a large change in the placement of floating gate 22. The select gate 20 is located over the channel portion 8b near the drain region 3 and isolated from the channel portion 8b by the oxide layer 7a. Floating gate 22 extends from the upper of the select gate 20 to the channel portion 8a near the source region 5 and is isolated from the channel portion 8a by the oxide layer 7b. The control gate 24 is stacked over the floating gate 22 and the dielectric layer 26 is sandwiched between them. Therefore, the select gate 20 and the floating gate 22 are located over the channel between the drain region 3 and the source region 5.

The select gate 20 has the same function as the extended control gate 12a in solving the over-erase problem. That is, the select gate 20 can serve as a controlled switch to isolate the memory cell from the external column bias circuitry for preventing current leakage while the over-erase condition is occurring. On the other hand, the triple-poly split-gate memory cell occupies less chip space, although it also has an extended portion like the memory cell shown in FIG. 2. In the double-poly split-gate memory cell shown in FIG. 2, the chip space occupied by the floating gate 10 and the control gate 12 is almost the same as that in FIG. 1 to maintain the coupling ratio of the control gate 12 and the floating gate 10. Therefore, the extended control gate 12a is a primary factor in increasing the occupied chip space. However, in the triple-poly split-gate memory cell shown in FIG. 3, there is no limitation on the chip space occupied by the select gate 20. In addition, since the floating gate 22 and the control gate 24 are heaped over the select gate 20, a large coupling ratio between the floating gate 22 and the control gate 24 can be obtained in the less occupied chip space. Therefore, the occupied chip space of the whole gate structure is almost the same as that of the conventional stacked gate double-poly memory cell. Accordingly, such memory cell structure can effectively solve the over-erase problem without increasing the occupied chip space.

The triple-poly split-gate memory cell can be programmed by source-side hot-electron injection. While programming such a flash memory cell, a large positive voltage is applied to the control gate 24 and coupled to the floating gate 22. Therefore, an electric field can be generated between the floating gate 22 and the source 5 due to the potential difference and provides the hot electrons with sufficient energy to inject into the floating gate 22. In addition, the triple-poly split-gate memory cell can be erased by F-N tunneling effect through the drain region 3. However, such programming/erasing procedures still have several weaknesses, such as uniform injection and the electron injection efficiency.

SUMMARY OF THE INVENTION

Therefore, an object of the present invention is to provide a method for programming and erasing a triple-poly split-gate memory cell to achieve uniform injection, low programming current and high injection efficiency, thereby improving the whole performance of the flash memory.

The present invention achieves the above-indicated objects by providing a method of programming a triple-poly split-gate flash memory that is located in a well region. Such memory cell has a substrate region, a source region, a drain region, a select gate located over a channel between the source region and the drain region and near the drain region, a floating gate located over the channel between the source region and the drain region and near the source region, and a control gate located over the floating gate. First, a forward bias between the well and the substrate is applied to drive electrons in the well region to flow to the substrate region. Then a reverse bias between the substrate and the source region is applied to form a depletion region for accelerating the flowing electrons by electric fields. Meanwhile, the substrate region and the drain region can be reverse-biased. Finally, a maximal positive voltage signal is applied on the control gate and partially coupled to the floating gate. The accelerated electrons can acquire enough energy to inject into the floating gate. Since the hot electrons are provided by the well region and injected into the floating gate through the substrate region and the channel portion under the floating gate, uniform injection can be achieved. In addition, the programming current is quite low and the electron injection efficiency is high. In addition, the select gate can be applied to a voltage signal such that the channel portion under the select gate is non-inverted, thereby further improving the injection efficiency.

The present invention also provides a method of erasing a triple-poly split-gate flash memory. First, the select gate and the drain are biased to induce an inversion layer in the channel near the drain region and the floating gate. Then a maximal negative voltage signal is applied on the control gate and coupled to the floating gate to release electrons trapped in the floating gate to the drain region through the inversion layer of the channel by tunneling effect. In addition, a voltage signal can be applied on the source region to release the electrons trapped in the floating gate through the source region. Since the trapped electrons can be released both by the drain and the source regions, the discharging efficiency can be apparently improved.

Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

The triple-poly split-gate cell in the present invention is programmed by substrate hot electrons and erased by F-N tunneling effect through an inversion layer near the drain. The programming/erasing/reading procedures in this embodiment are described as follows, respectively.

The Programming Procedure

Figure 1:
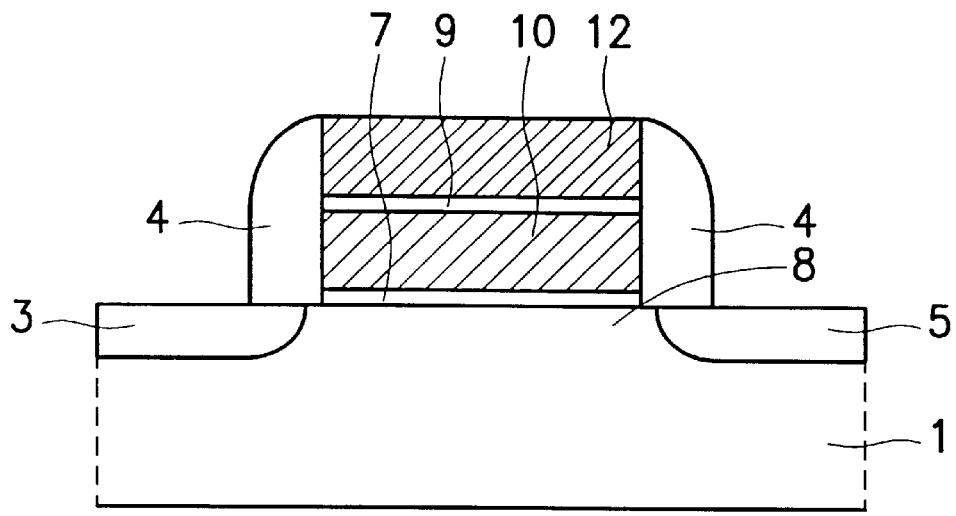
FIG. 1 (Prior Art) is a cross-sectional view of a conventional stacked gate double-poly flash memory cell.
Figure 2:
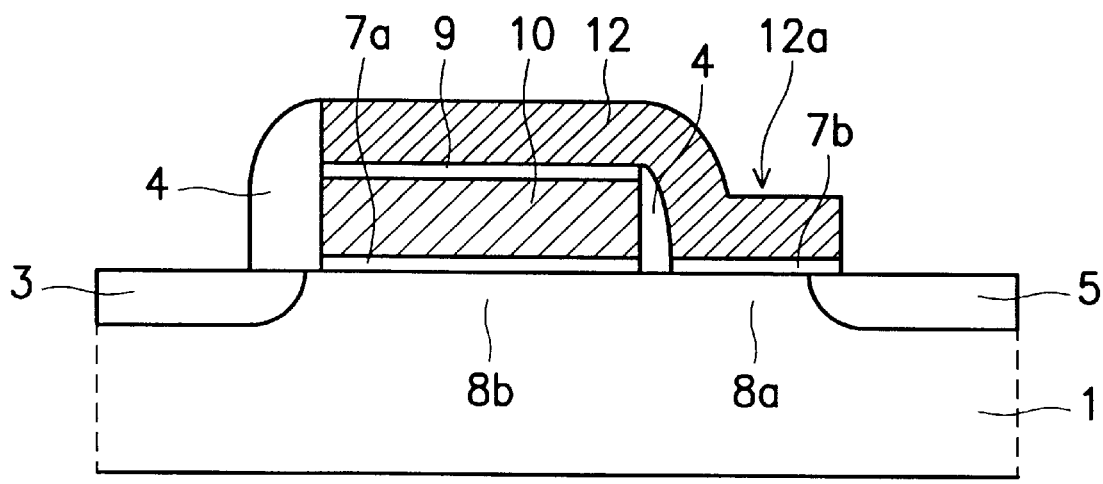
FIG. 2 (Prior Art) is a cross-sectional view of a conventional double-poly split-gate flash memory cell.
Figure 3:
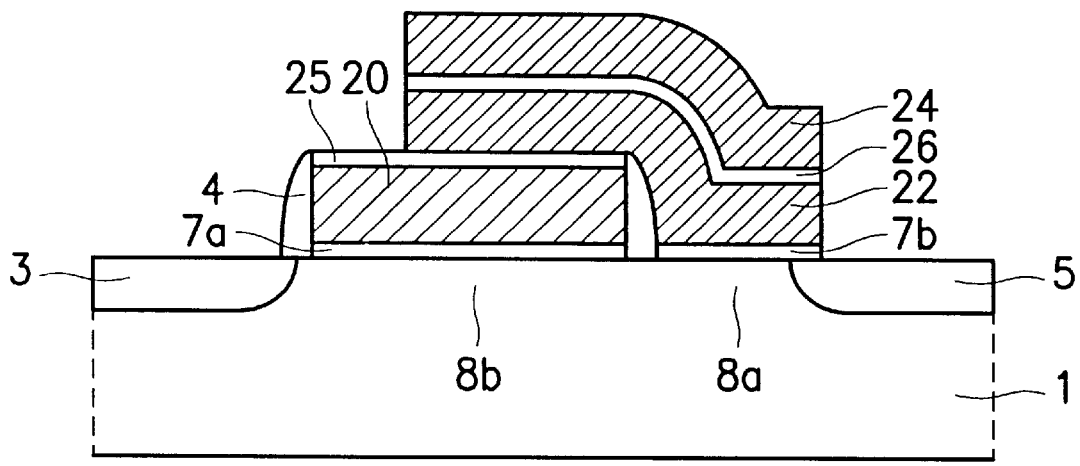
FIG. 3 (Prior Art) is a cross-sectional view of a conventional triple-poly split-gate flash memory cell.
Figure 4:
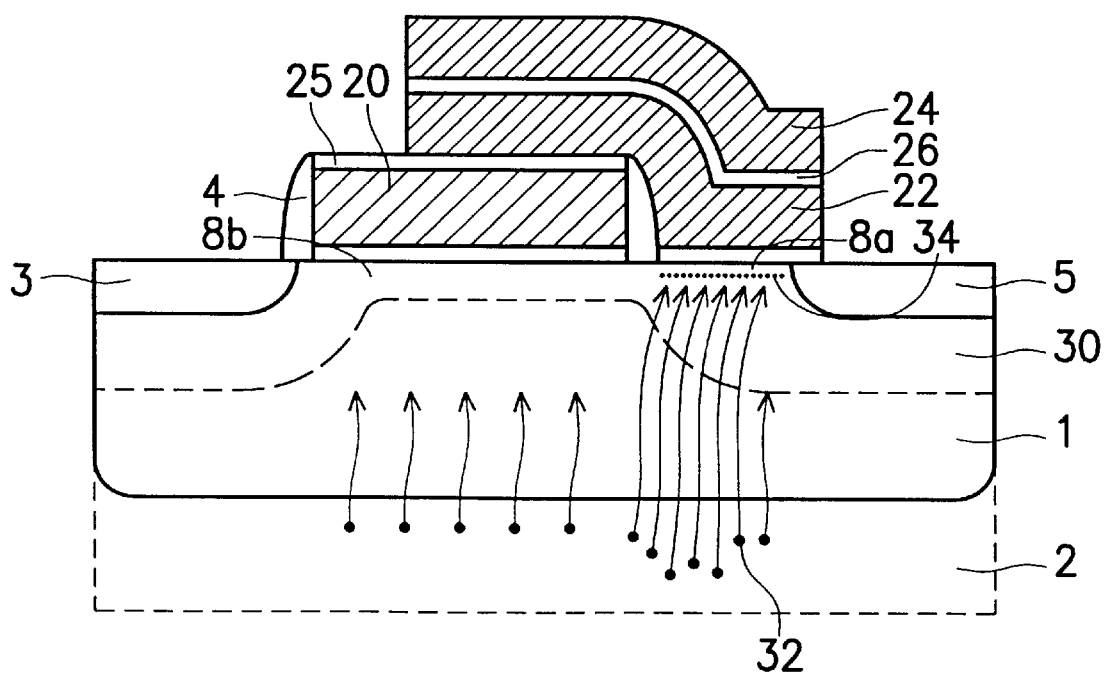
FIG. 4 is a cross-sectional view of the triple-poly split-gate flash memory cell being programmed by the method of the embodiment of the present invention.

FIG. 4 is a cross-sectional view of the triple-poly split-gate flash memory cell being programmed in this embodiment. In FIG. 4, numeral 2 represents a deep well region. In the NMOS transistor structure, the deep well region 2, the substrate 1 and the drain 3/source 5 are N-type, P-type and N-type, respectively. For generating electrons ready to be injected into the floating gate 22, a forward bias must be applied to the PN junction between the substrate 1 and the deep well region 2 and make the electrons 32 flow from the deep well region 2 into the substrate 1. In this embodiment, the applied voltage of the deep well region 2 is Vcc (volts) and the applied voltage of the substrate 1 is Vcc+0.7 (Volts). The reference voltage Vcc is about 3.3V in the 0.35 $\mu$m CMOS process.

A positive voltage, which is 2Vcc in this embodiment, is applied to drain 5 (and source 3 in this embodiment, for reverse-biasing the PN junction between substrate 1 and source 5. The reverse-biasing condition makes the depletion region 30 of the PN junction provide an electric field with sufficient strength to accelerate the electrons 32 flowing from the deep well region 2 into the substrate 1. These electrons 32 acquire a lot of energy and flow into the channel region 8a under the floating gate 22.

A maximal positive voltage, which is 3Vcc in this embodiment, is applied to the control gate 24. This positive voltage can be partially coupled to the floating gate 22 by means of the coupling between the control gate 24 and the floating gate 22. If the coupling ratio is about 0.8, the coupled voltage on the floating gate 22 is about 2.4Vcc. Therefore, such a coupled voltage inverts the channel portion 8a under the floating gate 22 and establishes an inversion layer 34. At this time, the electrons 32 having enough energy to overcome the potential barrier of the oxide layer 7b can tunnel into the floating gate 22 for programming.

In addition, for localizing the electrons 32 in the channel portion 8a under the floating gate 22, the channel portion 8b under the select gate 20 can be set in a non-inverted state; for example, the select gate 20 can be grounded (or connected to 0V). Such configuration can localize the electrons and further improve the programming efficiency.

The programming procedure is summarized as: (1) applying a forward bias between the deep well region 2 and the substrate 1 for driving the electrons from the deep well region 2 to the substrate 1; (2) applying a high positive voltage on the source 5 to reverse-bias the junction between the substrate 1 and the source 5 for accelerating the electrons; (3) applying a maximal positive voltage on the control gate 24 for injecting the accelerated electrons into the floating gate 22; and (4) making the channel portion 8*b* under the select gate 20 be in a non-inverted state for localizing the electrons in the channel portion 8*a* under the floating gate 22. The voltage values applied in the programming procedure of this embodiment are listed in the first row of the table shown in FIG. 6. It is noted that these voltage values can be modified according to practical requirements, such as the oxide thickness and the doping concentration of the substrate, and should not be used to limit the scope of the present invention.

The Erasing Procedure

Figures 5, 6:
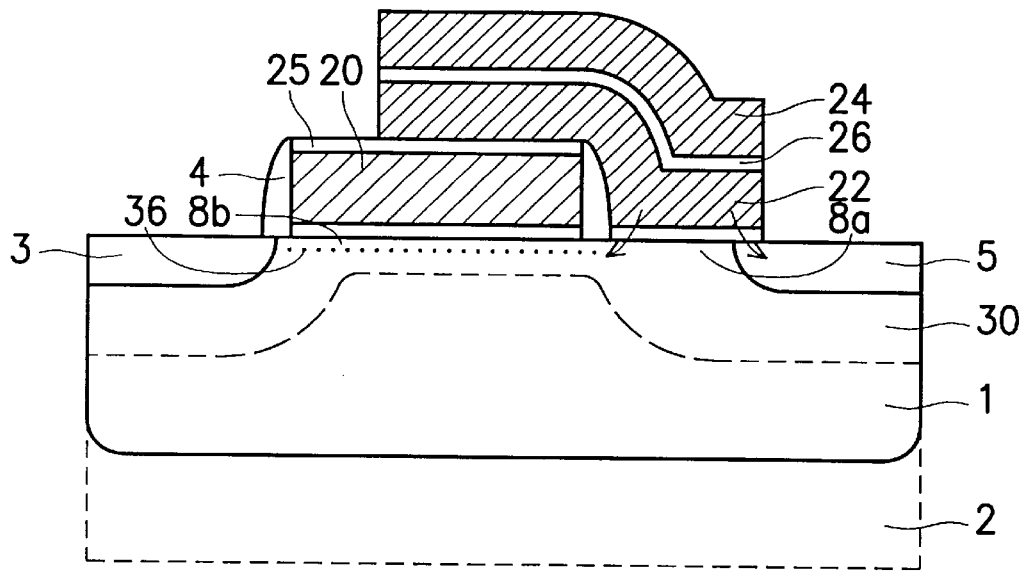
FIG. 5 is a cross-sectional view of the triple-poly split-gate flash memory cell being erased by the method of the embodiment of the present invention.
FIG. 6 is a table of the applied voltages in the programming/erasing/reading procedures of the present invention.

FIG. 5 is a cross-sectional view of the triple-poly split-gate flash memory cell be erased in this embodiment. First, the select gate 20 and the drain region 3 are properly biased so that the channel portion 8*b* under the select gate 20 is inverted and an inversion layer 36 is established. For example, the select gate can be biased at 2Vcc+Vt and the drain region 3 can be biased at 2Vcc, where Vt is the threshold voltage of the transistor. In addition, in the channel portions that are not located directly under the select gate 20, such as the channel portions under the spacers 4, a continuous inversion layer can also be established by the fringing field of the select gate 20. The established inversion layer 36, which is located in the channel between the drain region 3 and the floating gate 22, serves as a path for releasing the electrons trapped in the floating gate 22. In addition, since the select gate 20 is biased at 2Vcc–Vt, the point of the inversion layer 36 near the floating gate 22 exhibits a positive voltage. At this time, the deep well region 2 and the substrate 1 can be biased at Vcc.

A maximal negative voltage, which is –3Vcc in this embodiment, is applied on the control gate 24. This negative voltage can be partially coupled to the floating gate 22 by means of the coupling between the control gate 24 and the floating gate 22. Since there is a large voltage difference between the floating gate 22 (a negative voltage) and the point of the inversion layer 36 near the floating gate 22 (a positive voltage), a strong electric field can be established within such a short distance. This strong electric field can stimulate the electrons trapped in the floating gate 22 to flow into the inversion layer 36 by tunneling effect. Then these stimulated electrons can be released through the drain region 3 via the inversion layer 36. Accordingly, the operation of erasing data is achieved.

In addition, the conventional erasing scheme can also be incorporated in this embodiment, thereby speeding up the release of the electrons. In this case, a positive voltage, such as 2Vcc, is applied on the source region 5.

Using the voltage difference between the floating gate 22 (a negative voltage) and the source region 5 (a positive voltage), electrons can be simultaneously released via a second discharge path, the source region 5, by tunneling effect.

The erasing procedure can be summarized as: (1) inducing the inversion layer 36 connecting the drain region 3 and the floating gate 22; (2) applying a maximal negative voltage on the control gate 24 to release the trapped electrons through the drain region 3 via the inversion layer 36; and (3) applying a positive voltage on the source region 5 to release the trapped electrons through the source region 5. The voltage values applied in the erasing procedure of this embodiment are listed in the second row of the table shown in FIG. 6. It is noted that these voltage values can be modified according to practical requirements and should not be used to limit the scope of the present invention.

The Reading Procedure

The reading procedure is the same as that in the prior art. While reading data, Vcc can be applied on the control gate 24 and 2V can be applied on the select gate 20 and the drain region 3. Then the channel portion 8*b* under the select gate 20 is inverted. When the floating gate 22 contains charges, the channel portion 8*a* under the floating gate 22 is depleted and the channel 8 between the drain region 3 and the source region 5 is turned off, which represents a digit data "1." When the floating gate 22 does not contain charges, the channel portion 8*a* under the floating gate 22 is inverted and the channel 8 between the drain region 3 and the source region 5 is turned on, which represents a digit data "0." The voltage values applied in the reading procedure of this embodiment are listed in the third row of the table shown in FIG. 6.

The advantages of the programming/erasing procedures of the present invention are that:

1. Since the memory cell is programmed by substrate hot-electron injection, uniform injection can be achieved. Furthermore, the programming current is low and the injection efficiency is high.
2. Since the memory cell is erased by both the drain/source regions, the erasing efficiency is improved.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of programming a triple-poly split-gate flash memory, which is located in a well region and has a substrate region, a source region, a drain region, a select gate located over a channel between the source region and the drain region and near the drain region, a floating gate located over the channel between the source region and the drain region and near the source region, and a control gate located over the floating gate, comprising the steps of:

driving electrons in the well region to flow to the substrate region by applying a forward bias between the well and the substrate;

accelerating the flowing electrons by applying a reverse bias between the substrate and the source region; and injecting the accelerated electrons into the floating gate by applying a first voltage signal on the control gate and coupling the first voltage signal to the floating gate.

2. The programming method as recited in claim 1, further comprising a step of applying a second voltage signal on the select gate for inverting the portion of the channel between the source region and the drain region and beneath the select gate.

3. The programming method as recited in claim 1, wherein the first voltage signal is the maximum positive voltage provided to the triple-poly split-gate flash memory.

4. A method of erasing a triple-poly split-gate flash memory, which has a source region, a drain region, a select gate located over a channel between the source region and the drain region and near the drain region, a floating gate located over the channel between the source region and the drain region and near the source region, and a control gate located over the floating gate, comprising the steps of:

inducing an inversion layer in the channel close to the drain region and the floating gate for erasing the triple-poly split-gate flash memory; and applying a first voltage signal on the control gate, the first voltage signal being coupled to the floating gate to release electrons trapped in the floating gate to the drain region through the inversion layer of the channel.

5. The erasing method as recited in claim 4, further comprising a step of applying a second voltage signal that is larger than the first voltage signal on the source region to release the electrons trapped in the floating gate through the source region.

6. The erasing method as recited in claim 4, wherein the first voltage signal is the maximum negative voltage provided to the triple-poly split-gate flash memory.

* * * * *